United States Patent [19]
Braden et al.

[11] Patent Number: 5,863,331
[45] Date of Patent: Jan. 26, 1999

[54] IPC (CHIP) TERMINATION MACHINE

[76] Inventors: Denver Braden, 440 Jason La., San Marcos, Calif. 92069; Romulo V. DeVera, 8203 Jade Coast Rd., San Diego, Calif. 92126

[21] Appl. No.: 792,492

[22] Filed: Jan. 31, 1997

Related U.S. Application Data

[63] Continuation-in-part of Ser. No. 680,714, Jul. 11, 1996, abandoned.

[51] Int. Cl.⁶ .................... B05C 1/06; B05C 1/08
[52] U.S. Cl. .................... 118/261; 118/203; 118/249; 198/397
[58] Field of Search .................... 118/203, 249, 118/261; 198/397

[56] References Cited

U.S. PATENT DOCUMENTS

| | | | |
|---|---|---|---|
| 764,454 | 7/1904 | Giles | 118/249 |
| 1,191,537 | 7/1916 | Schall | 118/203 |
| 2,916,165 | 12/1959 | Newton | 198/397 |
| 3,698,537 | 10/1972 | Black et al. | 198/397 |
| 3,752,114 | 8/1973 | Knight | 118/203 |
| 4,167,226 | 9/1979 | Ackley et al. | 198/397 |
| 4,479,573 | 10/1984 | Ackley, Sr. et al. | 198/397 |
| 4,524,715 | 6/1985 | Abrams | 118/249 |
| 4,657,130 | 4/1987 | Ackley, Jr. et al. | 198/397 |
| 4,660,710 | 4/1987 | Swapp et al. | 198/397 |
| 4,673,077 | 6/1987 | Taniguchi | 198/397 |
| 4,708,233 | 11/1987 | Nomura | 198/397 |
| 4,798,277 | 1/1989 | Dubuit et al. | 198/397 |
| 5,090,031 | 2/1992 | Pyne et al. | 198/397 |
| 5,226,382 | 7/1993 | Braden | 118/406 |
| 5,415,322 | 5/1995 | Sala | 198/397 |
| 5,531,331 | 7/1996 | Barnett | 198/397 |

FOREIGN PATENT DOCUMENTS

| | | | |
|---|---|---|---|
| 18611 | 11/1980 | European Pat. Off. | 198/397 |
| 60-218219 | 10/1985 | Japan | 198/397 |

*Primary Examiner*—Donald E. Czaja
*Assistant Examiner*—Michael P. Colaianni
*Attorney, Agent, or Firm*—John J. Murphey

[57] ABSTRACT

A machine for terminating a computer chip with one or more stripes of a solderable paste, comprising a feed plate wheel defined by an outer marginal edge and having an upper exposed plate surface inclined to the horizontal against which an inventory of 3-dimensional chips is placed for loading, at least one narrow groove formed in the exposed plate surface directed outwardly toward the marginal edge wall and arranged to pass through the inventory and receive therein at least one of the chips in restricted orientation, a transfer cavity defined by enclosed side walls and a floor depending from the groove inboard the outer marginal edge for receipt therein of a chip from the groove in fixed orientation, the outer marginal edge wall having an aperture formed therethrough for transferring the chip from the cavity and, a transport device for urging the chip in a specific fixed orientation from the cavity outward through the aperture in a direction different than the direction from which the chip entered the cavity.

40 Claims, 10 Drawing Sheets

DRYING OVEN

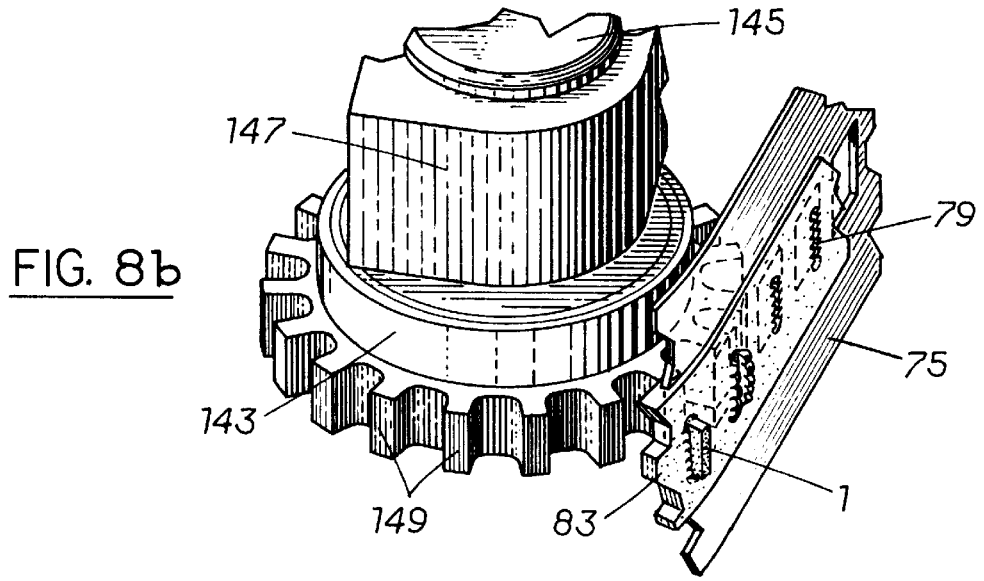
FIG. 8b
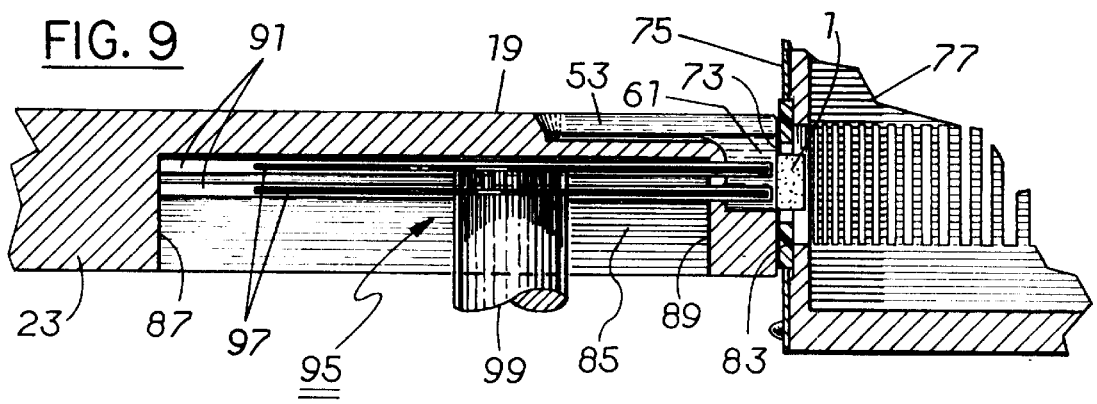
FIG. 9
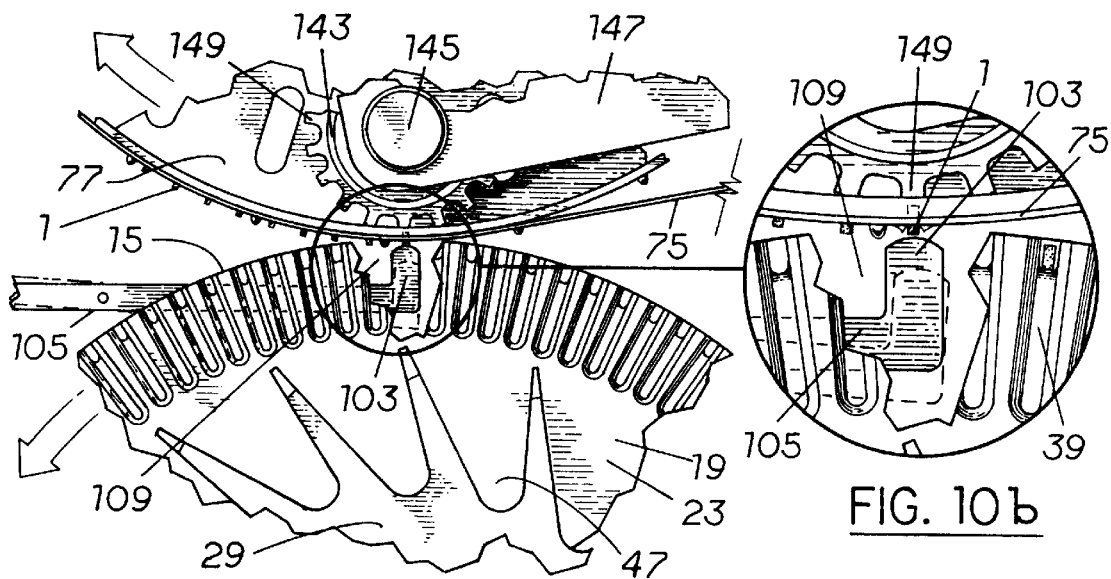
FIG. 10a
FIG. 10b

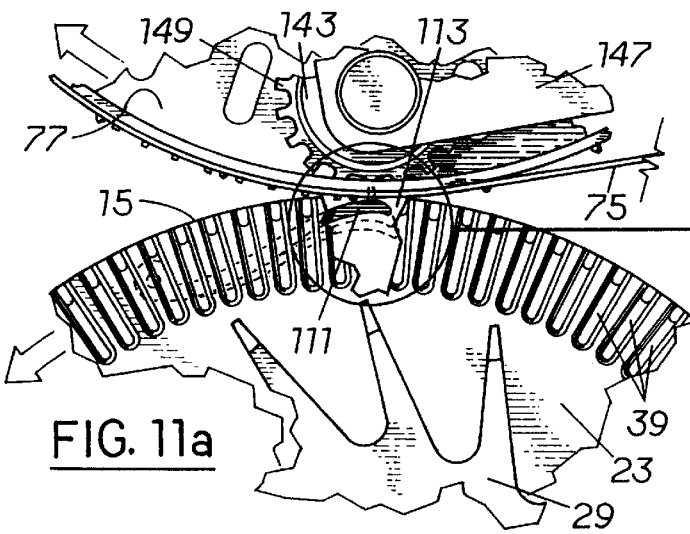
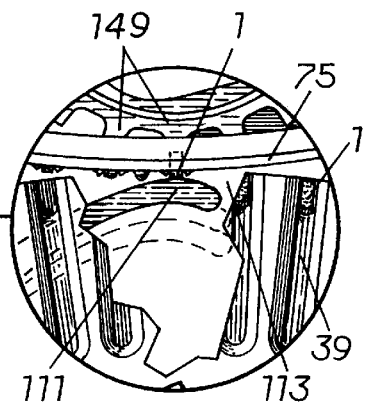
FIG. 11a
FIG. 11b
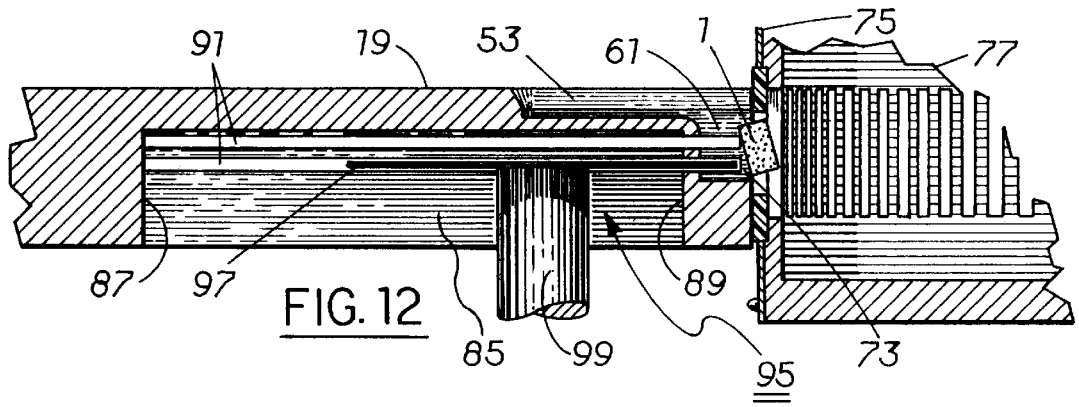
FIG. 12
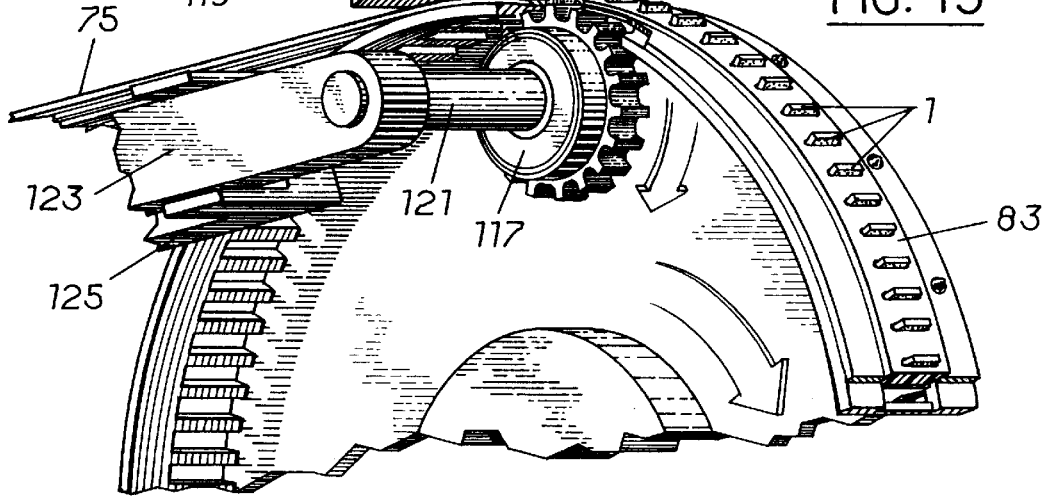
FIG. 13

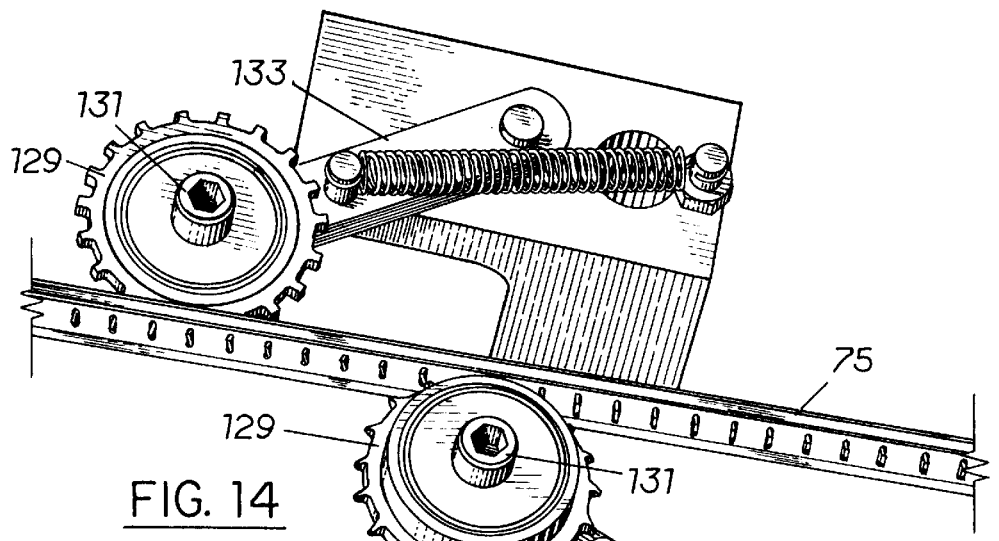
FIG. 14
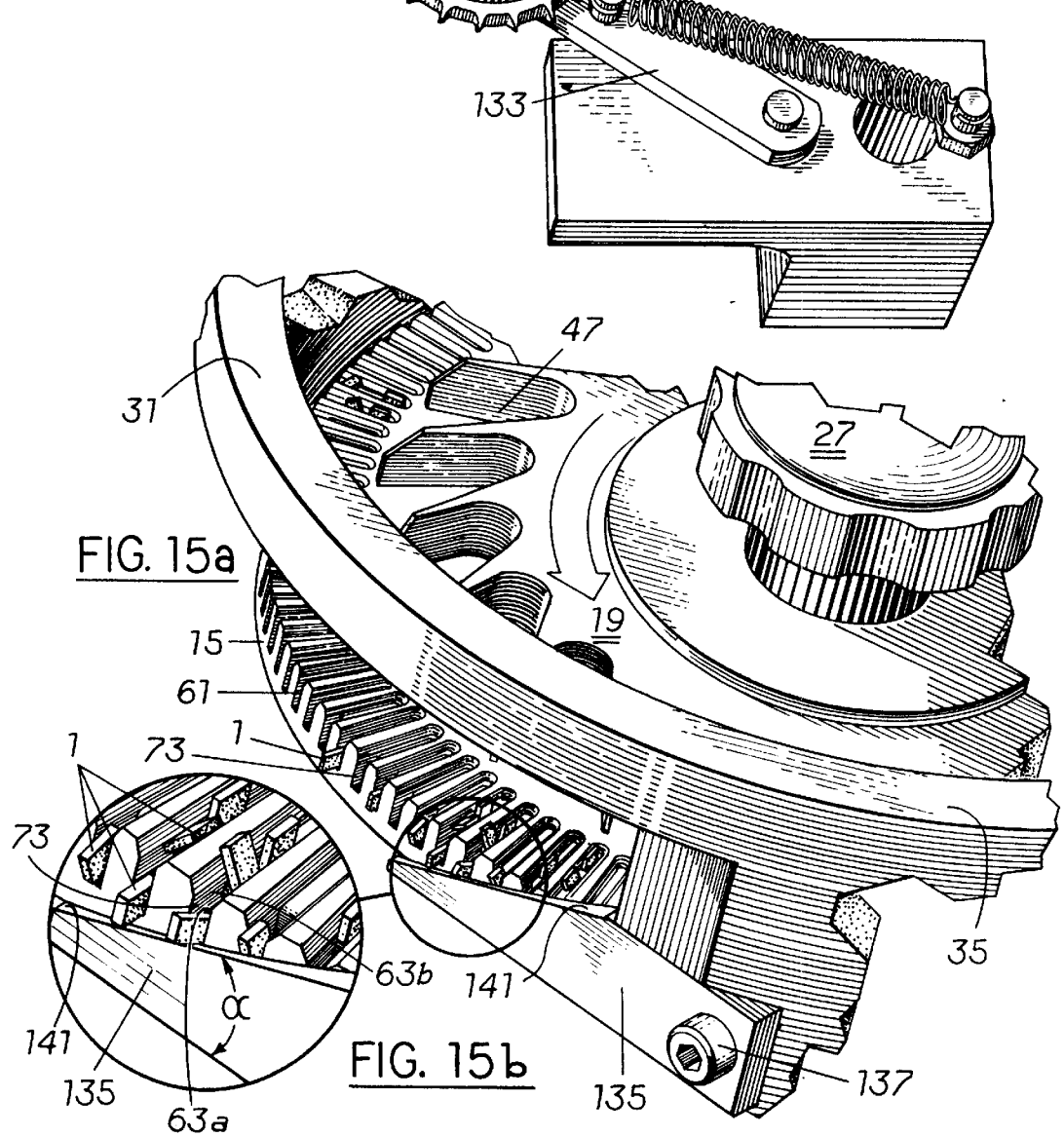
FIG. 15a
FIG. 15b

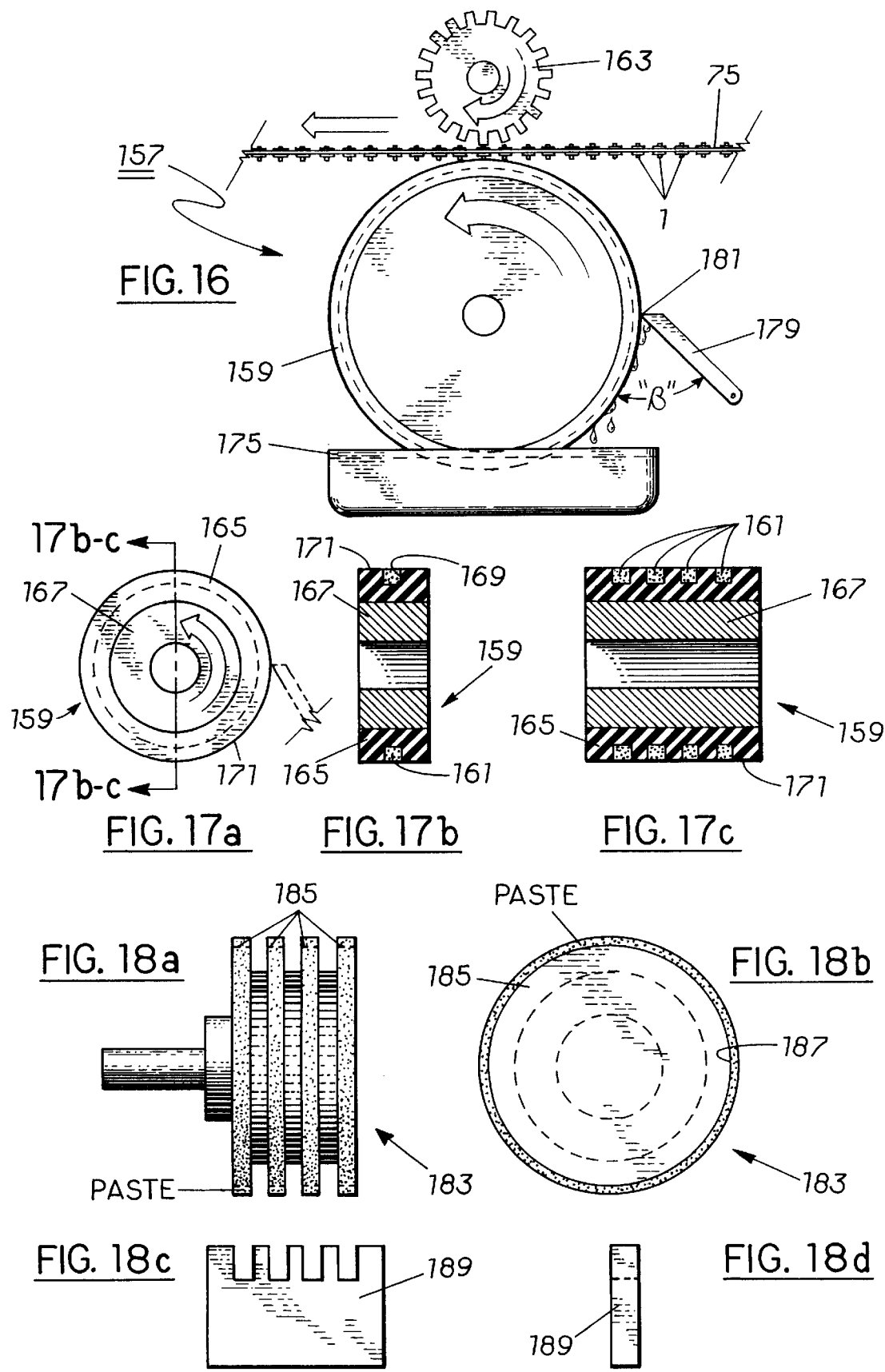

IPC (CHIP) TERMINATION MACHINE

RELATION TO OTHER PATENT APPLICATIONS

This is a Continuation-In-Part of previously filed patent application, titled "IPC (CHIP) TERMINATION MACHINE", filed Jul. 11, 1996 and carrying Ser. No. 08/680,714 now abandoned.

BACKGROUND OF THE INVENTION

1. Field of the Invention

This invention pertains to the field of computer hardware. More particularly, it pertains to a machine that applies minute quantities of solderable paste, in accurately controlled stripes and other geometries, to very small electronic components called Integrated Passive Components (IPCs) or "array chips" used in computer circuits, and to a feed mechanism that handles the chips in novel ways to load them into a pliable mask housed in a transfer tape or carrier belt for introduction to the paste-applying process.

2. Description of the Prior Art

Computers and computer-controlled appliances are becoming more powerful and can undertake and perform a wider range of tasks. To do so, computer component designers and manufacturers are cramming more and more components into them. And, in order to retain the size of the computers and appliances within a user-friendly range, the components are made smaller and are crowded closer together in the computer circuits.

The solid state capacitor has been reduced in size from the old-fashioned cylindrical device, about the size of a cigarette filter, with wires extending outward from each end, to a tiny rectangular "chip" that is smaller than a grain of rice. Instead of wires, one or more of the walls of the chip are striped with a solderable paste that is dried then fired to produce surfaces that later can be soldered directly onto a circuit board. Previously issued U.S. Pat. No. 5,226,382 discloses and claims a machine for placing a stripe or trace of solderable paste on surfaces of a chip and drying the paste so that the chip can later be fired. This machine uses a metal carrier belt or tape with rubber masks formed therein having slots in the masks into which the chips are positioned for processing. This machine can handle extremely small chips where opposed ends thereof are to be covered with paste.

Recently, a new computer circuit component has emerged that, while not necessarily smaller in overall size from the chip, crams a plurality of circuit components into a single array chip that is simultaneously solderable to a number of different electronic circuits. This device is called an Integrated Passive Component or IPC, but is still referred to in the industry as a "chip" and comprises a plurality or array, such as four or five separate capacitors sandwiched together in a single chip having overall dimensions such as top and bottom surfaces 0.1250 inches in length and 0.0600 inches in width, with opposed end walls 0.060 inches wide and 0.040 inches high and opposed side walls 0.040 inches high and 0.1250 inches long.

A typical IPC or array chip is shown in FIG. 1a with its wall surfaces marked as shown. To incorporate such a chip into a computer circuit requires separate solderable paste stripes placed along opposite surfaces such as the side surfaces or end surfaces and soldered onto copper traces formed on a circuit board as shown in FIG. 1b. The width of the stripes is generally set at 0.015±0.007 inches, with a 0.012±0.007 inch turn-down edge at the end of each stripe along the adjacent wall as shown in FIG. 1a. As with other chip components, after the paste is applied, it is subjected to a heat-drying cycle to set the paste, and thereafter to a firing cycle to fuse the paste on the chip.

With such a small chip and the small differences between the width and height of the chip, handling and insertion into the mask of the carrier tape has become extremely important. It is imperative that the multiple stripes be placed on only the appropriate surfaces and that their placement is accomplished with extreme accuracy. Any splashing of the paste onto other surfaces of the chip would provide a site for shorting the circuit and significantly degrading the actions of the computer. Accordingly, the feed means is not only required to place the chip into the carrier tape in a correct position and location, but the chip must also be handled correctly so that the appropriate surface is exposed in proper orientation to receive the stripes of paste with the requisite accuracy.

The matter of speed in loading has become quite important of late. The goal in the industry is to reach higher and higher processing speeds in order to lower the unit price of each chip. The principal reason for this higher speed is so that more chips are made per unit time in order to provide a larger base for amortizing the rather expensive striping machines. Other than the aforesaid previous U.S. Patent, the principal means of terminating chips involves the use of large metal and rubber plates where workers spread the chips over the holes in the plate by hand, then use another plate to press against the chips to force them partially through holes formed in the plate to expose the ends of the chips, whereupon the plate is placed in an apparatus and hand-dipped in a vat filled with the liquid paste. All this handling is very expensive and the speed of loading, dipping, and unloading is quite limited.

Further, it appears certain limitations are being reached in the prior art in the step of dipping the ends of the chips into the vat of terminating paste. While prior art methods are operable to dip an entire end of a chip in the paste, making stripes of the paste on a single, small surface, with accurate separation between the stripes on the order of 0.015 inches or less, is straining the capability of the prior art.

SUMMARY OF THE INVENTION

This invention is an automated chip terminating or striping machine incorporating a unique loading and positioning device and a novel striping device that allows very high-speed operation. The machine feed mechanism places the chips alone or in pairs in the mask of the carrier tape in controlled orientation and at speeds heretofore unknown in this industry. Placement of the stripes is accomplished by using a unique wheel containing circumferential grooves that are filled with paste, wherein the paste is compressed in a unique manner to force it to later rise above the interior walls of the grooves for rapid and very accurate transfer to the surfaces of the chips.

The invention includes a feed plate of finite thickness defined by a curved outer marginal edge that has an exposed plate surface inclined to the vertical against which an inventory of chips is placed. The feed plate is caused to turn about a central axis at an angle to the horizontal so that at any given time one part of the plate is at a height different than an adjacent part of the plate.

A plurality of narrow grooves are formed in the exposed plate surface and are directed radially outward over the surface that pass through the inventory of chips, as the plate turns, to pick up some of the chips in the grooves in restricted orientation. An edge guide covers that part of the plate located below horizontal to retain the chips in the grooves; that portion of the rotating plate above horizontal retains the chips in the grooves by gravity. The grooves are specially landscaped to receive the chips in restricted orientation. The term "restricted" is used herein to indicate that at least one of the dimensions of the chip, be it the length, width or height, is limited or, in other words, the chip can only be situated in the groove in two of the three possible orientations, on its back, its side or its end. A transfer cavity is formed at the farthest or distal end of each groove that descends or depends from the end of the groove down into the feed plate inboard from the marginal edge.

Optionally, the wheel is subject to vibration as it turns to aid the chips in entering the grooves and moving out therealong to ultimately drop, one-at-a-time or, optionally, two-at-a-time, into the transfer cavity in specific, fixed orientation. The term "specific" is used to indicate that all three of the dimensions of the chip are controlled so that each chip in the cavity is in the same orientation as every other chip in the other cavities. The term "fixed" is also used with "specific" to indicate that the chip cannot change its orientation once it enters the transfer cavity.

Another wide groove is formed under the feed plate, below the exposed surface, inboard from the transfer cavity and one or more narrow slots are formed in the wall through to the cavity. As the chips in the cavity are moved into juxtaposed relation with the opening of each mask in the carrier tape, one or more narrow wheels or other elements pass into the narrow slot or slots to advance or push the specifically oriented chips from each cavity outward through a transfer slot formed in the outer marginal edge into the slot formed in the rubber mask carried on the metal carrier tape or belt. The metal carrier tape is indexed into position adjacent the outer marginal edge of the feeder plate to receive the chips in the masks.

The carrier tape transports the chips, fixedly mounted therein, through alignment means to orient them and position them precisely in the masks. The chips are then carried to a striping area where they are passed into tangential contact with a paste wheel that carries the requisite amount of solderable paste in tiny grooves concentric about the circumference of the wheel. The paste is mounded up slightly in the grooves so that it contacts the chip side surfaces at the appropriate places to transfer the paste in proper alignment and place stripes across the surface of the chip and down a few thousandths of an inch along the adjacent surface of the chip. The freshly-coated chip is then passed through an oven where the paste is dried. The chips are later repositioned in the slots in the rubber masks to expose the opposite side surface. The operation is then repeated on this other exposed side surface and the heat pass repeated. The result is an accurately dual-surface striped chip that has been processed at very high speeds, such as on the order of 60,000 to 75,000 chips per hour.

In another embodiment of the invention, an off-center device, such as a single wheel situated to one side of the center-of-gravity in the chip, is used to not only move the specifically, fixed oriented chips from each transfer cavity outward through the transfer slots formed in the outer marginal edge into the slots formed in the rubber masks carried on the metal carrier tape, but causes the chips to rotate during said movement so that they become positioned in the masks in a slanted or angled orientation or at least an orientation different than the orientation while in the cavity.

Another wheel or wheels, located outside the area of transfer of the chips from the loading wheel to the carrier tape, are operable to rotate the chip in one direction or the other in the mask to locate the chip in the mask on end or on its side. This way the invention can be used to load chips in the carrier tape in a "half-way" orientation so that later one of two possible orientations is obtainable without the user having to change any setting of the machine except the position of the second wheel in order to change the orientation of the chip in the carrier tape. This embodiment reduces down-time of the machine when it is desired to change the striping activity from one chip surface to an adjacent surface.

In yet another embodiment of the invention, two chips, specifically fixed in side-by-side orientation, are loaded at one time in a cavity and simultaneously moved from the cavity into the mask where they are held in side-by-side orientation. Optionally, later in the process, a wheel or other means contacts the chips and simultaneously moves them in different directions to a new orientation for striping on a surface that was not present when the chips were first loaded into the masks. This two-chip loading and striping doubles the output of a machine without any significant rise in the cost of striping.

Another concern in the prior art is the fact that when the chip, having sharp marginal edges, enters between the lips forming the edges of the slot in the mask, the mask rubber or other pliable material becomes slightly abraded and, over time, becomes degraded such that the lips of the mask will no longer hold the chip tightly enough to withstand the rigors of later processing. This requires the carrier belt or tape to be replaced thus adding to the cost of operation.

In another embodiment of this invention, means are provided to contact the edges of the lips surrounding the opening in the mask, on the side opposite from where the chip will enter, and pre-open or spread the lips slightly so that the entering chip will not cut or abrade the rubber. This innovation prolongs the useful life of the carrier tape and reduces down-time, operating costs, and other maintenance delays.

Still further, a problem has been encountered where chips, that are misaligned in the masks, break off or crumble when they strike other elements of the machinery as they proceed through the processing steps. In addition, misaligned chips are often knocked out of the mask and lost to processing when they strike other elements of the machinery. Broken pieces of chips, as well as loose, whole chips, often cause excess carrier belt wear and possibly even safety problems if not removed from the machinery.

It has been discovered that if a highly polished curved surface is arranged at an acute angle adjacent the carrier tape on the drive pulley and in contact with the chips as they rotate out of adjacent position with the transfer means, any chip that is out of position may be gently moved into proper position in the masks thereby saving the loss of numerous chips, raising load density, and reducing operating costs.

In placing the stripes of solderable paste on the surfaces of the chip, a rubber wheel has been used which comprises a wheel of slightly flexible material having a plurality of thin grooves formed in the concentric surface thereabout. The wheel is dipped into the paste and a scraper, riding against the concentric surface, scrapes off the excess paste from the rotating wheel leaving the grooves filled with paste. The wheel is passed over the surface of the chip and the paste transfers from the grooves onto the surface of the chip leaving stripes of a thickness and width desired in the end product. The chip is then later dried and the opposite surface striped the same way. A problem has arisen in that the scraper must have its edge resting rather firmly against the wheel concentric surface in order to scrape off all the unwanted paste, yet this firmness, in some cases, leads to abrasion of the concentric surface and loss of clearness in the transferred paste.

It has been discovered that by using a non-compressible wheel, such as one made of metal, and resting the edge of the scraper against the surface thereof provides for "compressing" of the solderable paste such that, after the grooves come out from under the scraper edge, the paste actually mounds up in the grooves and takes on a rounded top surface. The later transfer of paste from these rounded grooves of paste produces a sharper stripe, with better tolerances and far less wear on the wheel.

Further, in another discovery, it was found that if the grooves were left empty and the groove walls were loaded with paste on their top surfaces, the transferred paste made an acceptable stripe, with clarity, good tolerances and thicknesses.

Accordingly, the main object of this invention is a machine for processing chips and applying single or multiple stripes of solderable paste very accurately on the various surfaces thereof while incorporating a very high speed feeding mechanism to accomplish this task. Other objects of the invention include a process of feeding large quantities of chips in a short time to existing chip-carrying tapes or belts for processing with solderable paste; and, a means of applying a plurality of stripes of solderable paste using a roller-application wheel in an accurate manner.

Still other objects of the invention include a method of placing the chip in a slanted orientation in the mask so that it can be later rotated one way or the other to place the side or the end surface in position to be striped; a means of providing a choice of orientation to the chip so that one of two possible surfaces may be striped without requiring upstream changes to be made in the chip-handling features of the invention; a means of reducing the abrasion of the pliable lips of the mask by pre-opening the lips prior to entrance of the chips into the slots in the mask; a means of doubling the output of the invention by placing two chips in the same mask, in side-by-side juxtaposition and passing them through the striping process simultaneously; and, a means for making clearer stripes of solderable paste with far more accuracy between the stripes than heretofore possible.

These and other objects of the invention will become more apparent upon reading the following description of the preferred embodiment taken together with the drawings appended hereto. The scope of protection sought by the inventors may be gleaned from a fair reading of the Claims that conclude this Specification.

DESCRIPTION OF THE DRAWINGS

FIG. 8b is an illustrative enlargement of sprocket and chip holding slot/tape alone, for clarity;

FIG. 9 is a partial cross-sectional elevation view of the major groove under the wheel and the means for moving the chip from the cavity into the mask;

FIG. 10a is a sectional plan view of another means of transporting the chip from the wheel to the mask;

FIG. 10b is an enlargement of a portion shown in FIG. 10a;

FIG. 11a is still another sectional plan view of another means of transporting the chip from the wheel into the mask;

FIG. 11b is an enlargement of a portion shown in FIG. 11a;

FIG. 12 is still another partial, cross-sectional view of the manner in which the chip is moved from the cavity into the mask in an angled orientation;

FIG. 13 is a sectional, partial-illustrative view of wheels that move the chip vertically and horizontally in the mask;

FIG. 14 is an illustrative view of wheels used for rotating the chip in the mask from its initial orientation;

FIG. 15a is an illustrative view of a plurality of chips oriented in place in the grooves and of the device for moving non-aligned chips into proper alignment—the belt wheel is removed for clarity;

FIG. 15b is an enlarged view of the alignment ramp shown in FIG. 15a;

FIG. 16 is a basic, front elevational view of the striping stage of the machine of this invention;

FIGS. 17a, b & c are end and sectional side illustrative views, respectively, showing paste filling the grooves therein;

FIGS. 18a and b are, respectively, a side and an end view of the paste striping wheel showing the paste to be located on the top of the walls between the grooves instead of in the grooves;

FIGS. 18c and d are, respectively, a side and an end view of the comb that is used with the paste striping wheel of FIGS. 18a and 18b to scrape off all the paste except which resides on the top of the walls between the grooves;

DESCRIPTION OF THE PREFERRED EMBODIMENT

Turning now to the drawings wherein like elements are identified with like numerals throughout the 32 figures, the reader is referred to U.S. Pat. No. 5,226,382 for a general disclosure of the termination machine to which the feed plate means of this invention are to be attached and this patent is incorporated herein by reference. Generally, this patent discloses a means to load the computer chips (single capacitors) into an endless metal carrier tape that contains first apertures to receive sprocket teeth from the tape driving means and second apertures around which a pliable mask is fixed having an aperture formed therein for receiving the chips therein in proper orientation. The tape or belt carries the chips through a termination area where one surface of the chips is covered with solderable paste, then through a drying cycle, then to an upset area where the chip is moved slightly in the mask to expose the opposite surface thereof for later coating, then back through the drying cycle, and ultimately ejected into a product bin.

Figure 1A:
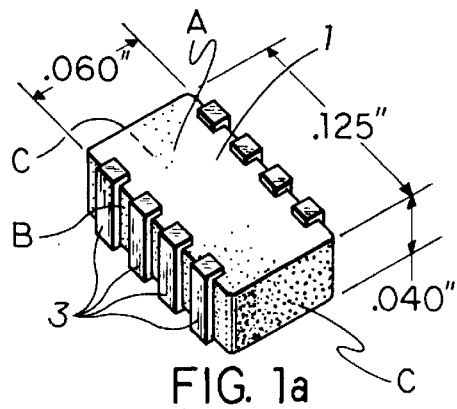
FIG. 1a is a trimetric view of a typical Integrated Passive Component (chip) which is coated with stripes of solderable paste according to the teachings of this invention.
Figure 1B:
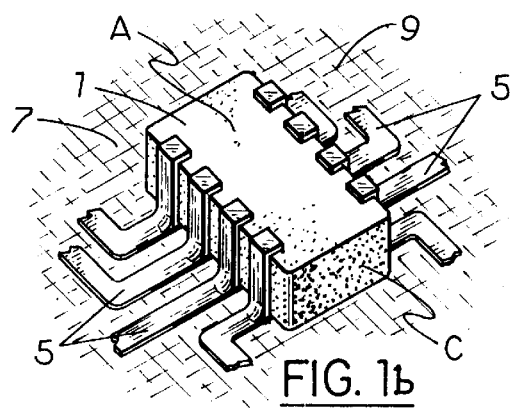
FIG. 1b is an illustrative view of the chip shown in FIG. 1 mounted on the surface of a circuit board.

The Integrated Passive Component or array chip 1 treated in this machine is shown in FIG. 1a with its dimensions set forth for its top and bottom walls or surfaces A, opposed side walls B and opposed end walls C, and showing a typical plurality of stripes 3 of solderable paste located across the side walls B of said chip. Note that stripes 3 are required to extend slightly onto the adjacent top and bottom walls A of chip 1. The typical dimensions of stripes 3 are 0.015±0.007 inches and the downward extension of stripes 3 is about 0.012±0.007 inches. The striped chip is shown soldered to copper traces 5 formed on the upper surface 7 of a circuit board 9 shown in FIG. 1b.

Figure 3:
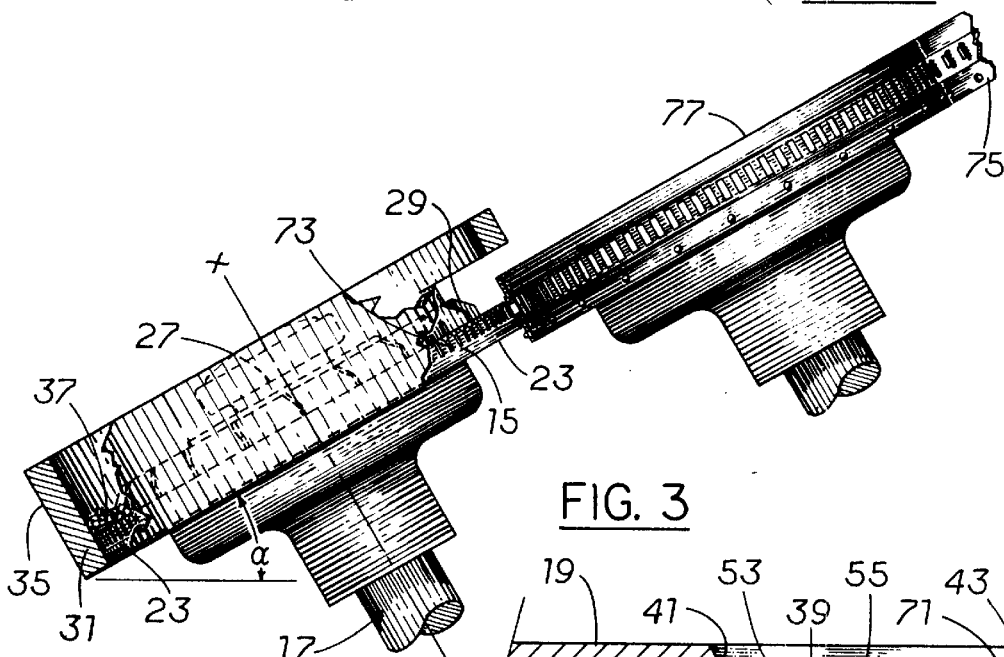
FIG. 3 is a side elevational view, partly in cross section, of the feed plate means of this invention in position against the carrier tape for loading the chips into the masks.
Figures 2A, 2B:
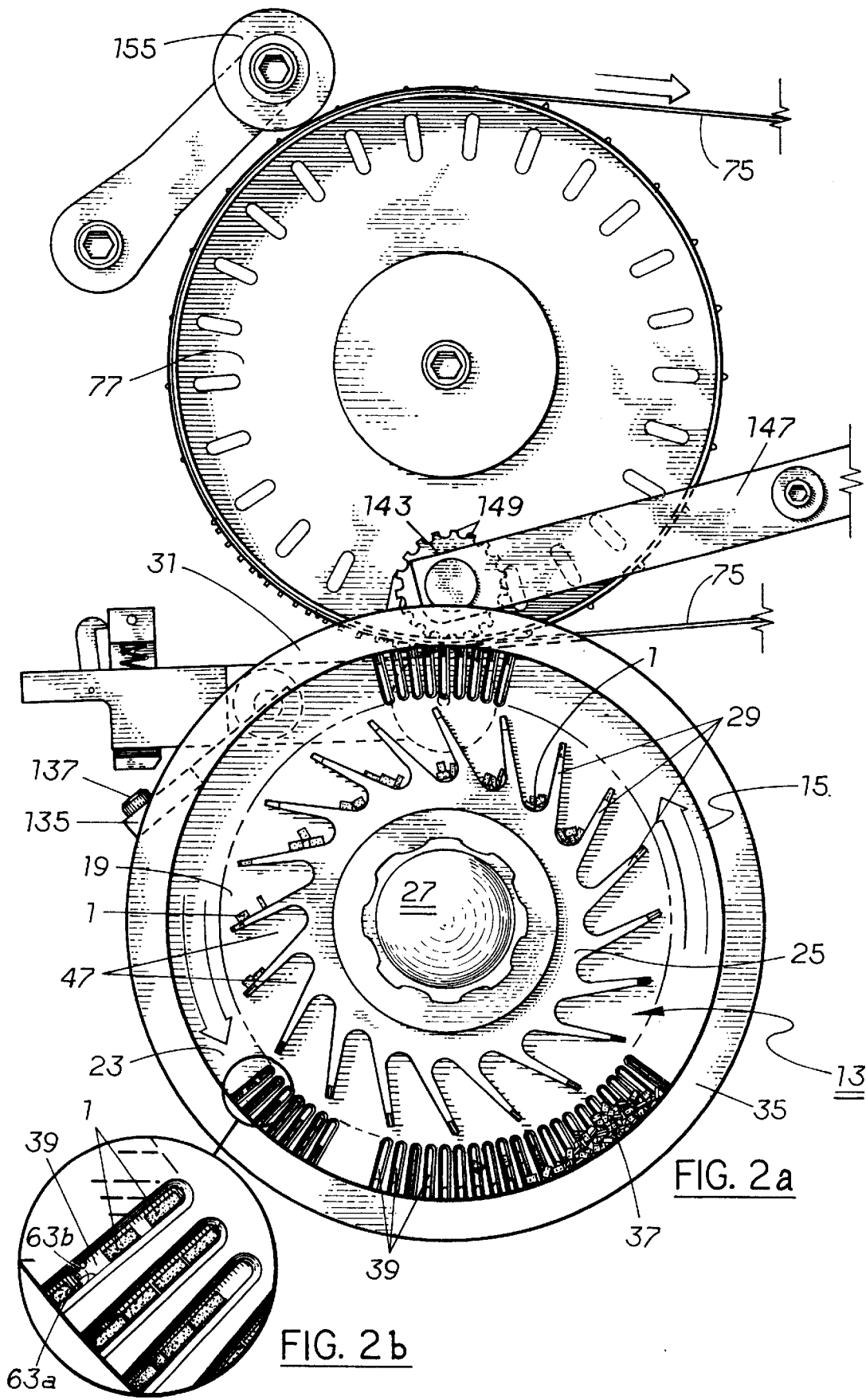
FIG. 2a is an illustrative plan view of the carrier belt and masks in relation to the novel feed plate means of this invention.
FIG. 2b is a partial blow-up of a section of the novel feed plate showing chips in position for further movement.

As shown in FIGS. 2a and 3, one part of this invention includes a feed plate means 13 which is defined by an outer marginal edge 15 that is preferably circular in overall shape. Means 13 is shown to be mounted on spindle 17, along a central axis x-x, said spindle being supported on typical bearings (not shown) and arranged to turn at controlled speeds by a motor drive (also not shown), as is known in the prior art.

Means 13 may take on a wide variety of sizes and shapes as long as it defines outer marginal edge 15 and further contains an exposed or upper plate surface or face 19, preferably flat or planar, that is inclined to the horizontal at an angle "α" ranging from 20° to 70° and more preferably about 45°. Feed plate means 13 is preferably a flat-faced wheel 23 that maintains the angle of inclination "α" throughout its rotation and is driven at a speed controlled by a d.c. motor. Vibration may be added to wheel 23 through the d.c. motor or by a coil and armature as is known in the prior art.

A chip distributing ring 25 is centrally placed over upper plate surface 19 and fastened thereto by a threaded central knob 27. Ring 25 contains a plurality of arms 29 radiating outwardly from knob 27 toward, but short of, outer marginal edge 15 that are preferably angled rearward from the direction of turning of wheel 23, such turning direction shown by arrows.

An edge guide 31 is provided that preferably comprises a band or wall 35 that conforms to the curvature of outer marginal edge 15 of wheel 23 and is mounted adjacent thereabout along the lower elevation of wheel 23 and that also rises slightly above upper plate surface 19. Guide 31 provides a place at the lower elevation of wheel upper plate surface 19 where an inventory 37 comprising a plurality of chips 1 may be located and kept from spilling off of upper plate surface 19.

At least one, but preferably a plurality of narrow grooves 39, each defined by an inner proximal end 41 and an outer distal end 43, are formed in side-by-side arrangement in wheel upper plate surface 19, beginning inboard, near knob 27 and proceeding outwardly, preferably radially outwardly, toward outer marginal edge wall 15. While the overall length of grooves 39 do not appear to be critical to the operation of this invention, it is preferred that they be about ¾ inches long so that they can hold a minimum of three or more chips each.

Arms 29 of chip distributing ring 25 form a plurality of pockets 47 thereabout on upper plate surface 19 and retain chips 1 therein for entrance into grooves 39 to keep chips 1 from falling from a higher level on plate surface 19 down into inventory 37 located at a lower level on plate surface 19. The reason for this is that pockets 47 retain chips 1 near grooves 39, so that the loading density is maintained at a relatively high rate, and, in addition, prevent chips 1 from falling across upper plate surface 19 where such a fall might scratch, chip or otherwise damage the surface of a chip.

Figure 4:
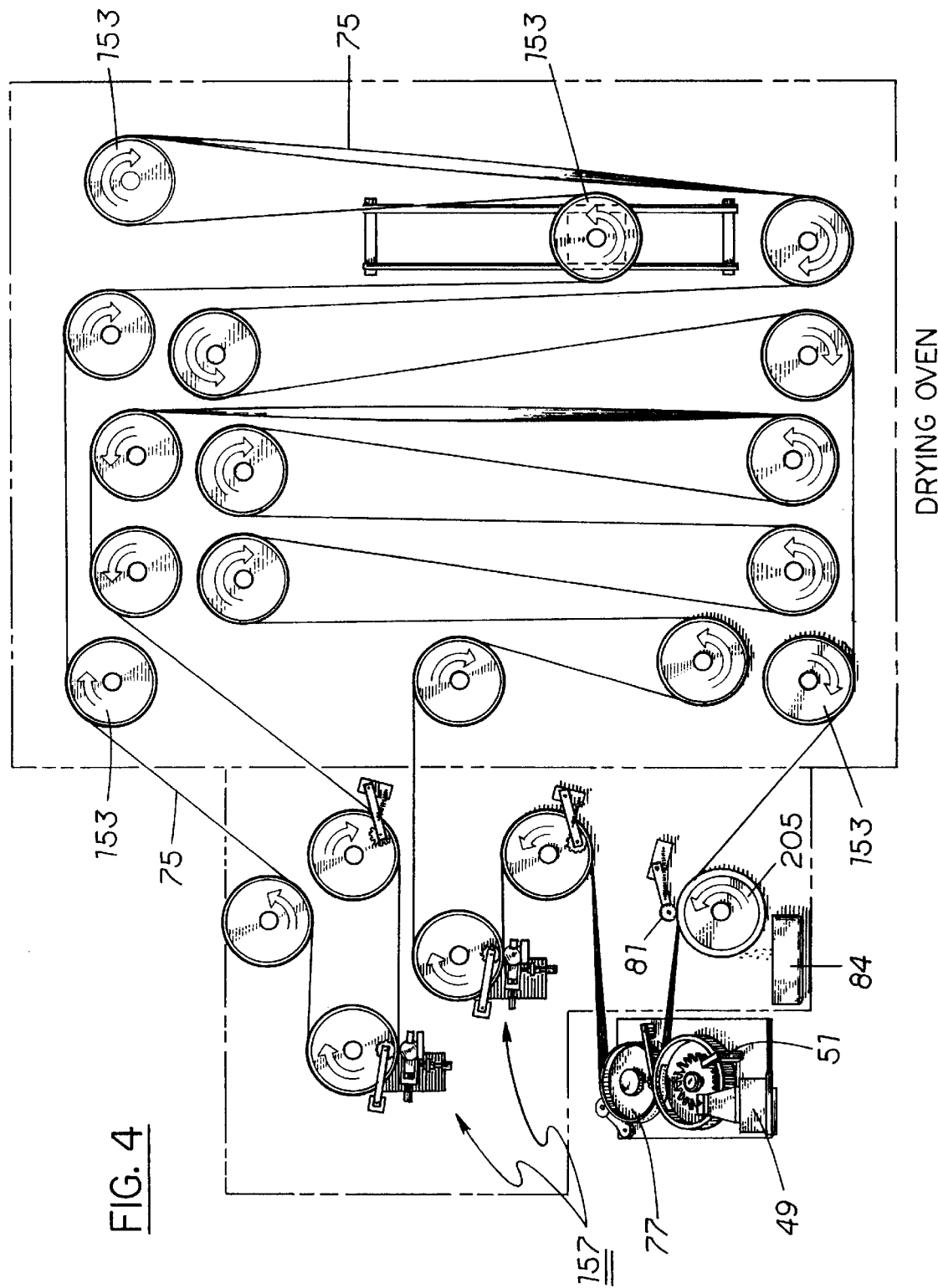
FIG. 4 is a general arrangement, front elevation, showing the various components in their respective operative positions.
Figure 5:
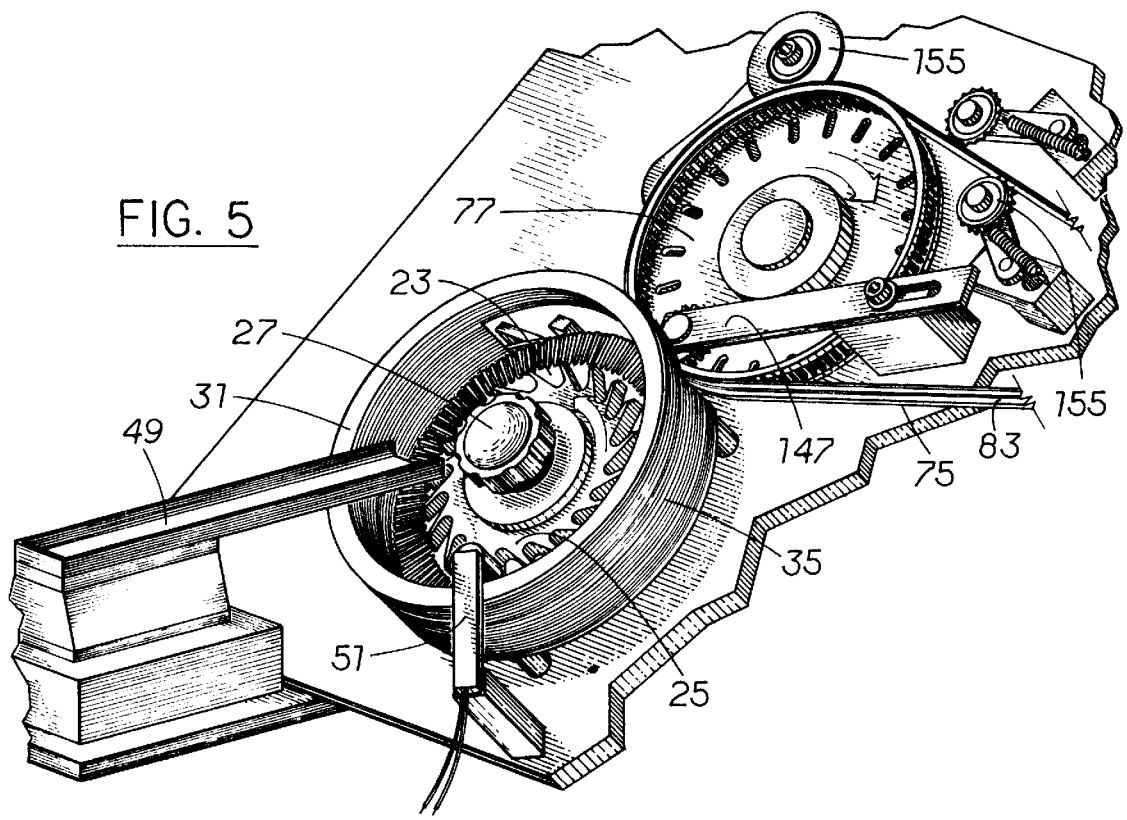
FIG. 5 is another illustrative view of the loading means and inventory monitoring means of chips in the loading device of this invention.

FIG. 2a shows a clearer view of chip distributing ring 25 and shows pockets 47 located near grooves 39 to keep chips 1 from falling across the slanted face of upper plate surface 19. As shown in FIG. 4, an option is to provide a vibrator feeder/trough assembly 49 with, or as part of, feed plate means 13, to transfer a rather continuous quantity of chips 1 into or on top of upper plate surface 19 as a function of inventory 37. The size of inventory 37 is monitored by an optical monitoring device 51, as shown in FIGS. 4 and 5, and, when inventory 37 runs low, assembly 49 is automatically turned on to feed more chips into the top of upper plate surface 19.

Figure 6:
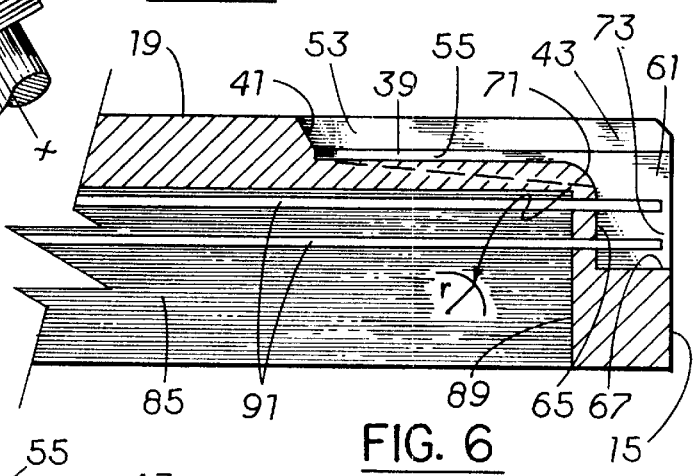
FIG. 6 is a partial cross-sectional side view of the groove and the transfer cavity in relation to the aperture through which the chip is passed into the mask.
Figure 7:
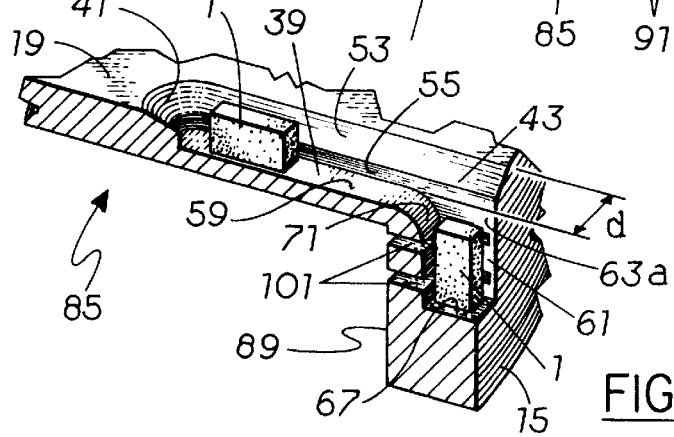
FIG. 7 is still another partial cross-sectional view of the transfer cavity and aperture through which the chip passes.

As shown in FIGS. 6 and 7, grooves 39 have outwardly slanted or inclined upper side walls 53 and vertical lower side walls 55 as well as a flat bottom wall or floor 59 where the distance "d" between groove upper side walls 53 slant outward a few thousandths of an inch more than the thickness of the chip being processed. While the chip can be fully positioned in the groove lying either on its side wall B or end wall C, it is at least partially oriented because it cannot fit into groove 39 lying on its top or bottom wall A.

As feed plate means 13 rotates, grooves 39 pass through chip inventory 37 and some of the chips from the inventory fall or pass into grooves 39 aided by slanted upper side walls 53. Gravity retains chip inventory 37 in pockets 47 and at the bottom of wheel face 19 or upward along the downstream side of upper plate surface 19 as wheel 23 rotates. Movement of chips 1 in grooves 39 may also be aided by vibration imparted to feed plate means 13 as is known in the prior art.

In addition, as shown in FIG. 6 as an alternate embodiment, groove flat bottom wall 59 may remain constant from inner proximal end 41 to outer distal end 43 as shown in solid line. Optionally, flat bottom wall 59 may slant downward from proximal end 41 to distal end 43 as shown in dotted outline in FIG. 6. The flat bottom wall or floor 59, in its slanted configuration, adds a vector of gravity to aid in moving the chips along groove 39.

As shown in FIGS. 6 and 7, a transfer cavity 61, preferably open-topped, is formed inboard of wheel outer marginal edge 15 and at distal end 43 of each groove 39. Cavity 61 depends or descends from the bottom of groove 39, at distal end 43, in a downward direction, preferably parallel to central axis x-x, and is defined by a pair of opposed, spaced-apart cavity side walls 63a and 63b (see FIGS. 2b and 15), that are extensions of lower groove side walls 55, a cavity inner end wall 65 and a cavity floor 67, said side walls, inner end wall and floor joined together along their respective marginal edges.

As shown in FIG. 7, the width of transfer cavity 61 is set such that chip 1 can only fit therein in a specific orientation, i.e., if it is oriented laying on its side wall B or its end wall C. The choice of having the side wall or the end wall adjacent groove floor 59 is important to later orientation of chip 1 in the cavity. In the preferred embodiment of the invention and as shown in FIGS. 6 and 7, groove bottom wall or floor 59 undergoes a 90° change in direction at a bend 71, about a fixed radius "r" to become cavity inner end wall 65.

Figure 8A:
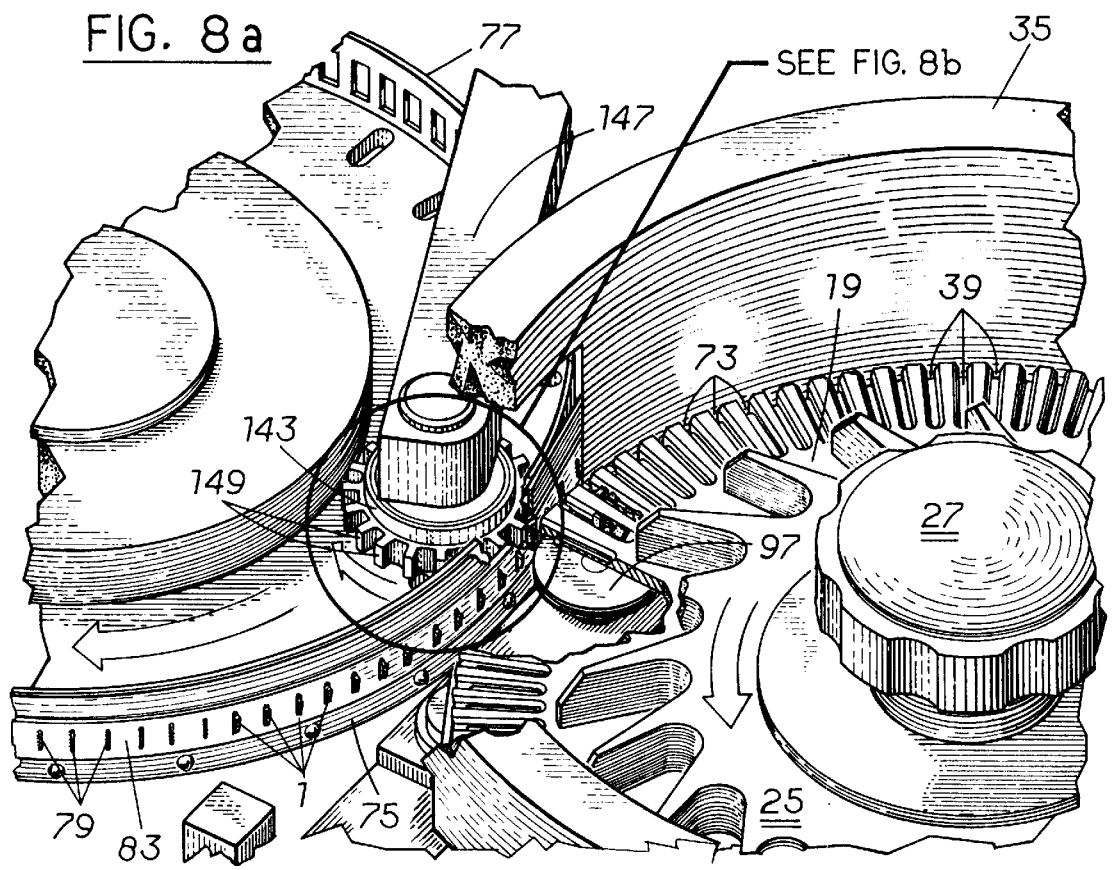
FIG. 8a is a partial cross-sectional view of the transfer means employed to move the chip from the cavity into the mask.
Figure 20:
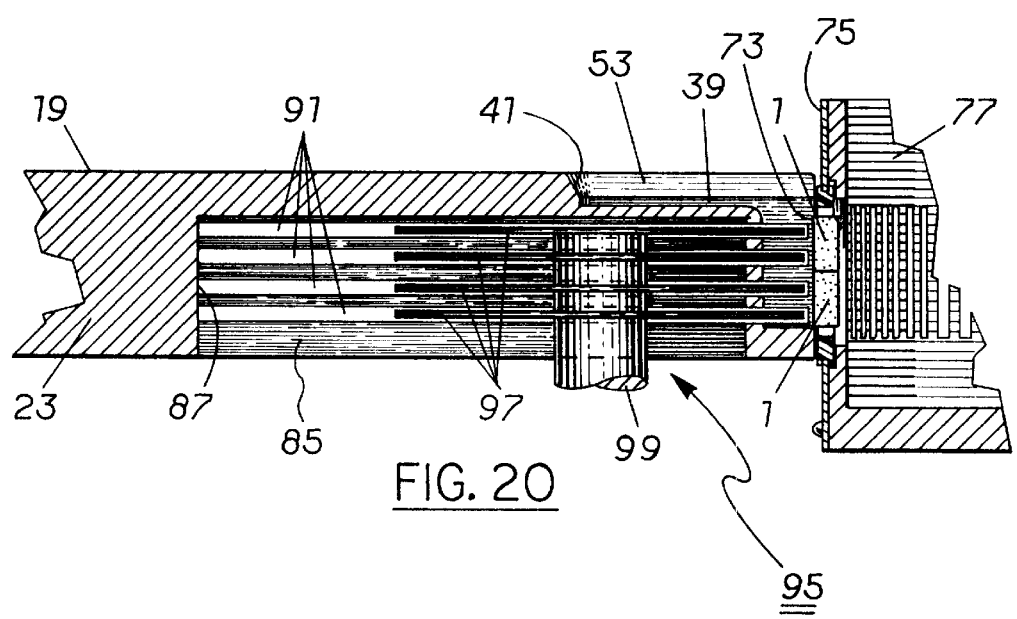
FIG. 20 is still another cross-sectional view of the wheels that move two chips at a time from the cavity to the mask; and, FIG. 21 is an illustrative view of wheels that rotate two chips in one mask from one orientation to another.

As shown in FIGS. 6 and 7, and 8a, outer marginal edge 15 of feed plate means 13 has an aperture 73 formed therein, arranged in vertical alignment with cavity 61, and is of such a width and height as to allow at least one chip 1 to pass in specific, fixed orientation radially outward therethrough from cavity 61. As shown in FIGS. 3 and 9, aperture 73 is of a size and shape as to allow one chip 1 to pass therethrough. As shown in FIG. 20, aperture 73 is of a size and shape to allow two chips 1, in end to end, juxtaposed position to pass therethrough.

Termination machine carrier belt or tape 75 is passed over a drive pulley 77, as shown in FIGS. 2a, 4 and 5, and arranged to come into aligned position adjacent outer marginal edge 15 of wheel 23, as shown in FIGS. 8a and 10a, so that the chip-holding slot 79 in mask 83, carried on carrier tape 75, is aligned with aperture 73. In operation, the turning motion of wheel 23 and the movement of carrier belt 75 are controlled so that the alignment is made between each successive slot 79 with each successive aperture 73.

A wide second groove 85 is formed under exposed upper wheel surface 19, as shown in FIGS. 6, 7, 9 and 12, inboard of cavity 61, bounded by an inner groove wall 87 and an outer groove wall 89. At least one, but preferably two or four slots 91 extend from outer wall 89 into transfer cavity 61 as shown. A transport means 95, is provided for moving chip 1 from its location in cavity 61 radially outward into chip holding slot 79 located in mask 83 held in carrier belt 75 positioned adjacently thereagainst. The movement of chip 1 by transport means 95 is in a new direction, or in other words, said means moves chip 1 in a direction from cavity 61 different than the direction from which chip 1 entered cavity 61.

In the embodiments shown in FIGS. 9, 12, and 20, means 95 is shown to comprises at least one, but often a pair or more of very thin, small diameter wheels 97 set alone or in close, spaced-apart parallel proximity to each other, that are mounted on a common shaft 99 for turning, and at least one, but often a pair or more of close, spaced-apart parallel slots 101 (see FIG. 7) in which wheels 97 pass through into cavity 61. The circumferential velocity of wheel 23 and the circumferential velocity of wheels 97 are controlled and coordinated so that there is little or no difference in perimeter velocity therebetween. As cavity 61 arrives opposite mask slot 79, wheel or wheels 97 have already penetrated cavity 61 through slots 101 and urged chip 1 (or both chips as shown in FIG. 20) from cavity 61 radially outward through aperture 73 into mask 83. Cavity 61 is thus emptied of chip or chips 1 and proceeds on wheel 23 back around and down into chip inventory 37 to be filled again on the next revolution 14 from chips that remain in connecting groove 39.

Transport means 95 may take a form other than small wheels 97 and slots 91. As shown in FIGS. 10a and 10b, means 95 may include an oscillating head 103 that is driven by a lever 105 to move in a reciprocal path out of and into an aperture 109 formed in outer groove wall 89 to push chip 1 out of cavity 61 and into mask slot 79.

As shown in FIGS. 11a and 11b, transport means 95 may take the form of a spring-loaded scraper 111 inclined to outer wall 89 of wide second groove 85 that extends into a single slot 113 to urge chip 1 out of cavity 61 and into mask slot 79 as wheel 23 is rotated. All of these alternate embodiments are included in this invention.

In another embodiment of this invention, as shown in FIG. 12, chip 1 may be moved out of cavity 61, through aperture 73, and into slot 79 in mask 83 by such means as a single wheel 97 and rotated during the movement, as shown, so that chip 1 becomes positioned in slot 79 in an angled or partially rotated orientation. As shown in FIG. 13, such a partially rotated orientation later allows secondary positioning means 115 to be used to rotate the chip one way or the other or move it up, down, or sideways in slots 79 to present the top and bottom walls or the side walls for striping. In FIG. 13, secondary positioning means 115 is shown to comprise a tooth-covered locating wheel 117 and a smooth edged wheel 119, mounted for rotary motion on shafts 121 extending from arms 123 that are pivotally mounted to a chassis 125, on which the entire loading device is mounted. Arms 123 may be held in operative position by springs or other known means. This embodiment allows the user to change orientation of chip 1 in masks 83 without undue alteration of the basic loading means such as the replacement of another loading wheel 97 (with a newly oriented cavity 61) and the like.

Another embodiment to accomplish the rotation of chip 1 in mask slots 79 is shown in FIG. 14 wherein a pair of sprocketted wheels 129 is pivotally mounted on shafts 131 that are, in turn, mounted on spring-loaded arms 133. The sprockets contact chip 1, outboard from its center of gravity (usually the geometric center of the chip), and rotate the chip in slot 79. Any number of wheels 129 may be utilized and chip 1 may be rotated into any desired orientation in mask slot 79.

In still another embodiment of this invention, shown in FIGS. 15a and 15b, a unique positioning and chip saving device is provided in the form of an alignment plate 135, rigidly mounted by bolt 137 to a chassis 125, that contains a highly polished surface 141 that comes into contact, at an acute angle "α", with chips positioned in transfer cavity 61. Properly positioned chips in cavity 61 slide by surface 141 without contacting it while misaligned chips come into gradual contact with polished surface 141 and are gently rotated or moved into proper alignment in cavities 61. It is believed that the combination of the highly polished surface 141 and the gradual contact made between the chip and surface 141, due to its acute angle of introduction, is responsible for the alignment of misaligned chips and the saving of many chips that would otherwise be lost to the process.

As further shown in FIG. 8b, a wheel 143 is rotatably mounted on a shaft 145 in an arm 147 that positions said wheel 143 on the opposite side of masks 83 (and carrier tape 75) from the point of introduction of chips 1 from their respective transfer cavities 61 into chip holding slots 79. A series of sprocket-like blunt teeth 149 are formed about the circumferential edge of wheel 143 and are of a size and shape to contact mask 83 above and outside chip holding slot 79. The depth of penetration of sprockets 149 is carefully adjusted to spread the lips of chip holding slot 79 or pre-open slot 79 toward transfer cavity 61 during the transfer phase of chip 1 from transfer cavity 61 into chip holding slot 79. This momentary and partial penetration of sprockets 149 against chip holding slots 79, on the opposite side of where the transfer of chip 1 takes place, significantly reduces the contact between the sharp edges of chip 1 with the pliable lips of slot 79 thereby reducing abrasion, previously described herein, that has caused thinning of the rubber or elastomeric mass in the area of slot 79. Carrier belt 75 is maintained in a taut condition throughout the chip loading activity of this inventive machine by use of an idler wheel 153, as shown in FIG. 4. Idler wheel 153 is moved by a cable (not shown) connected to an air cylinder (not shown) which is connected to wheel 153. Idler wheel 153 slides upward and downward on two bearings (not shown) and rods (not shown).

As shown in FIG. 5, carrier tape or belt 75 carries chips 1 in their respective masks 83 from the loading station through one or more sets of alignment wheels 155, locating wheels 117 and sprocketted wheels 129, to align the chips in the masks, and then to a paste application stage generally indicated at 157. As shown in FIGS. 16, and 17a, 17b and 17c, a first paste roller 159 is provided that includes one (FIG. 17b) or more (FIG. 17c) circumferential groves 161 formed concentrically in a sleeve 165 formed about a cylindrical core 167. Each groove 161 is separated from an adjacent groove by an interior groove wall 169 that is of a width and depth to carry sufficient solder paste for one pass onto the appropriate surface of chip 1. An exterior surface 171 is provided to define the upper edges of grooves 161.

Roller 159 is preferably made of metal, hard rubber or a combination of the two. Roller 159 is arranged to turn at a circumferential velocity where the top of interior groove walls or exterior surface 171 is at the same circumferential velocity as carrier belt 75, and is slightly submerged in a vat 175 of liquid solderable paste. The action of turning first roller 159 in the still paste aids in having the paste picked up in grooves 161. A scraper 179 is provided that contains a scraper edge 181 that rests against the turning exterior surface 171 at an angle "β". By positioning scraper 179 at the angle "β", excess paste is scraped back into vat 175 and, simultaneously, the paste remaining in grooves 161 is hydraulically compressed such that it rebounds after passing out from under scraper edge 181 to become slightly mounded up above the top of exterior surface 171. As the paste-filled groove or grooves 161 are brought into contact with the appropriate surface on chip 1, the paste is transferred from grooves 161 to the chip's surface and overlapped onto the adjacent top and bottom surfaces as required. By adjusting the pressure of scraper 179 against first roller 159, the desired amount of paste is closely controlled.

As shown in FIG. 18a, b, c, and d, a different method of applying paste to chip 1 is shown. Here, a different type of striping wheel 183 is shown where the paste application surfaces are not grooves but circumferential wheels 185, each with a circumferential paste application surface 187 on which a layer of paste is applied as shown in FIG. 16. After wheels 185 dip into vat 175, a comb-shaped scraper 189 is applied to the surface of wheels 185 to scrape away the paste from between surfaces and to scrape the layer of paste remaining on top of application surfaces 187 to a finite and controlled depth. Upon touching application surfaces 187 to chip 1, the paste is transferred from surface 187 to the appropriate chip surface.

Figure 21:
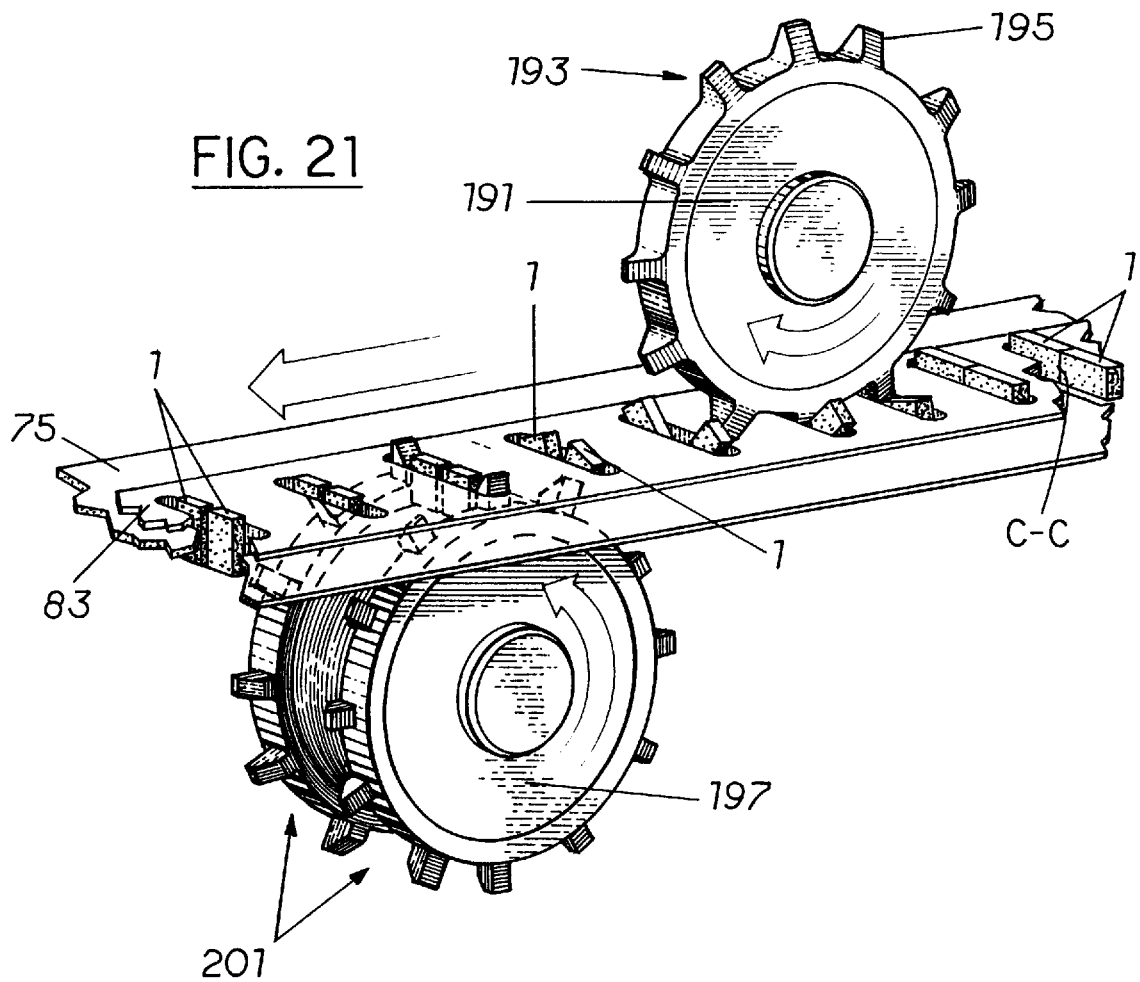

In another embodiment of the invention, shown in FIGS. 20 and 21, transfer cavity 61 is deepened to accept two chips 1 in end to end position of specific, fixed orientation and the chips are then transferred out through aperture 73 by wheels 97 into mask slot 79. As shown in FIG. 21, a first sprocket-shaped wheel 191, carrying a single row 193 of semi-pointed teeth 195 is positioned on one side of tape 75 and arranged to contact the dividing line between the side-by-side chips 1 to rotate each of them outwardly about their center of gravity to begin turning each of them in mask 83. After passing through this operation, a second sprocket-shaped wheel 197, carrying a double row of angled teeth 201 and arranged to contact chips 1 and rotate them outwardly to turn them the rest of the 90° to present their appropriate surfaces for striping. These sprocket-shaped wheels and their rows of semi-pointed teeth, and slight modifications of them, may be chosen to rotate the chips one way or the other. Loading two chips in side-by-side arrangement, as described and shown herein, clearly doubles the production rate of the machine.

A fresh striped chip is then carried by belt 75 to a drying stage, as shown in FIG. 4, where the chip and paste is subjected to a heat cycle to dry the paste. After exiting the drying cycle, as shown in FIG. 13, the chip is carried, by locating wheel 117 that acts to move the chip across mask 83 to expose the opposite surface of chip 1 for striping. As previously described, instead of pushing chip 1 through mask 83 to expose the opposite surface for striping, it may be passed by sprocketted wheels, such as that shown in FIG. 14, to rotate the chip 180° about its center of gravity to expose its opposite surface for striping with solderable paste. After this second striping operation, the chip is then again subjected to a drying cycle.

Figure 19:
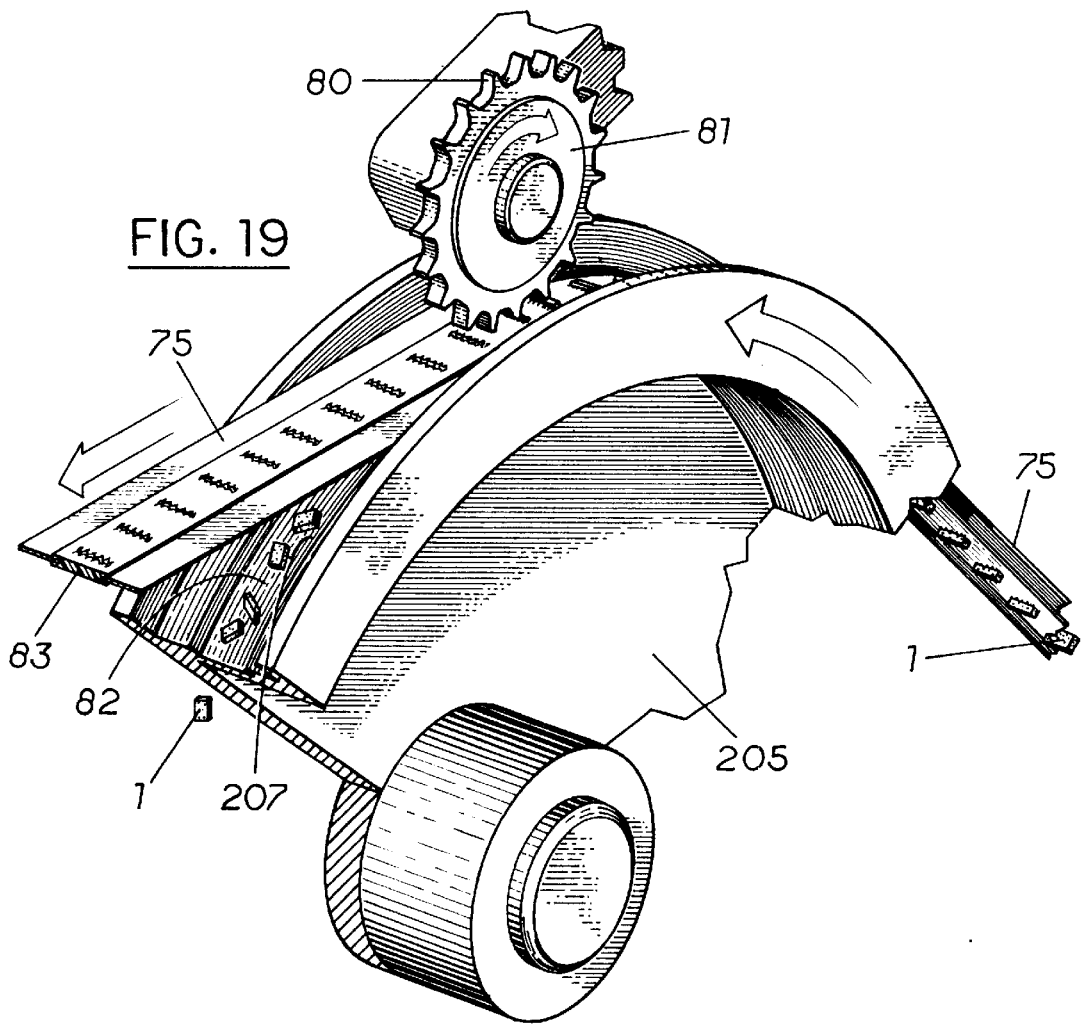
FIG. 19 is a partial, cross-sectional illustrative view of the chip ejection means from the carrier tape/mask.

As shown in FIG. 19, the striped and dried chip is then ejected from carrier tape 75 by contact with a row of blunt teeth 80 mounted on a wheel 81 to push them out of masks 83 onto moving chute 82 for conveying to a gathering point (not shown).

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the same way to achieve substantially the same result are within the scope of this invention.

What is claimed is:

1. A machine, including a carrier tape for loading a plurality of computer chips and applying at least one stripe of paste on one or more surfaces of said chips, comprising:

a) feed plate means of finite thickness defined by an outer marginal edge, having an upper exposed plate surface inclined to the horizontal against which an inventory of 3-dimensional chips is placed for loading;

b) at least one narrow groove formed in said exposed plate surface directed outwardly toward said marginal edge and arranged to pass through said inventory and receive therein at least one of the chips from said inventory in restricted orientation;

c) a transfer cavity defined by enclosed side walls and a floor depending from said groove inboard said outer marginal edge for receipt therein of at least one chip from said groove in specific fixed orientation;

d) said outer marginal edge of said feed plate means having an aperture formed therethrough for transferring the chip from said transfer cavity to said carrier tape; and, e) transport means for urging the chip in a specific, fixed orientation from said transfer cavity outward through said aperture into said carrier tape in a direction different than the direction from which the chip entered said cavity.

2. The chip termination machine of claim 1 wherein said transfer cavity is of a size and shape for receipt therein of two chips from said groove in end-to-end fixed orientation.

3. The chip termination machine of claim 1 wherein said feed plate means includes a wheel mounted on a central shaft, inclined to the horizontal, and arranged to turn thereabout.

4. The chip termination machine of claim 1 wherein said upper exposed plate surface is planar.

5. The chip termination machine of claim 1 wherein said upper exposed plate surface is planar and is inclined about 20° to about 70° from the horizontal.

6. The chip termination machine of claim 1 wherein said upper exposed plate surface is planar and is inclined about 45° from the horizontal.

7. The chip termination machine of claim 3 wherein said inventory of chips is located at the lower elevation of said upper exposed plate surface.

8. The chip termination machine of claim 3 further including a chip distributing ring centrally placed over said upper plate surface.

9. The chip termination machine of claim 8 wherein said chip distributing ring forms a plurality of pockets thereabout on said upper plate surface for retaining the chips therein for entrance into said at least one narrow groove and to keep the chips from falling from the highest level on said plate surface down into said inventory.

10. The chip termination machine of claim 1 wherein said narrow groove is straight.

11. The chip termination machine of claim 10 wherein said narrow groove is further defined by outwardly sloping upper side walls.

12. The chip termination machine of claim 1 wherein said upper exposed plate surface is planar and wherein said narrow groove is directed radially outward from the center of said plate means and is elongated.

13. The chip termination machine of claim 1 wherein said transfer cavity is sized and shaped to hold a single chip in specific orientation.

14. The chip termination machine of claim 1 wherein said transfer cavity is open-topped.

15. The chip termination machine of claim 1 wherein said aperture in said outer marginal edge comprises a vertical slot of a width and height to allow one chip to pass therethrough in a specific, fixed orientation.

16. The chip termination machine of claim 1 wherein said transport means includes at least two rotating wheels mounted on a common shaft, said wheels adapted to enter narrow slots formed in said plate means inboard said transfer cavity, and pass into contact with the chip at a location about said feed plate means to urge the chip outward through said aperture.

17. The chip termination machine of claim 1 wherein said transport means includes one rotating wheel arraigned to enter a narrow slot formed in said plate means, inboard said transfer cavity, and pass into contact with the chip in said transfer cavity at a point apart from the center of gravity of the chip to urge the chip outward through said aperture and simultaneously rotate said chip into an angled orientation.

18. The chip termination machine of claim 1 wherein said transport means includes at least four rotating wheels mounted on a common shaft in closely spaced-apart arrangement, said wheels adapted to enter narrow slots formed in said plate means inboard said transfer cavity, and pass into contact with two chips located in said transfer cavity in end-to-end specific fixed orientation to urge the chips outward, in end-to-end arrangement through said aperture.

19. The chip termination machine of claim 1 wherein said transport means includes a head inboard said transfer cavity pivotally mounted on an arm said head arranged to pass into said transfer cavity in a reciprocal motion to forces the chip located therein outward through said aperture into said carrier tape.

20. The chip termination machine of claim 1 wherein said transport means includes a spring-loaded wiper arm inboard said transfer cavity biased into contact with the chip located in said transport cavity and arranged to move said chip outward through said aperture into said carrier tape.

21. The chip termination machine of claim 1 further including a curved edge guide formed about said outer marginal edge wall and in close juxtaposition therewith to move chips from a position hanging out of the end of said groove back into said groove to prevent the chips from falling off said upper exposed plate surface.

22. The chip termination machine of claim 1 further including means to vibrate said feed plate means during its rotational motion to aid in moving the chips constituting said inventory into said grooves.

23. The chip termination machine of claim 1 further including means to feed loose chips onto said upper exposed plate surface and means cooperative therewith for monitoring the size of said inventory of chips developed by said plate feed means.

24. The chip termination machine of claim 1 wherein said transfer cavity and said aperture are sized to two of the three dimensions of the chips in the inventory to allow passage of the chips from said transfer cavity through said aperture in only one orientation.

25. The chip termination machine of claim 1 wherein said groove is narrower than one of the three dimensions of the chips in said inventory to allow insertion of the chips therein, in only two of the three possible orientations.

26. The chip termination machine of claim 1 wherein said groove is further defined by an inner proximal end and an outer distal end and a groove floor that begins at said proximal end and progressively deepens as said groove extends outward toward said distal end and terminates at said cavity in a smooth curved change of direction to form an inner end wall defining said cavity.

27. The chip termination machine of claim 1 wherein said groove is further defined by an inner proximal end and an outer distal end and a groove floor that begins at said proximal end of said groove and remains at the same depth throughout said groove and terminates at said cavity in a smooth curved change of direction to form an inner end wall defining said cavity.

28. A machine including a carrier belt for terminating a computer chip with one or more stripes of a solderable paste, comprising:

a) a feed plate wheel defined by a circumferential marginal edge and having a planar upper exposed plate surface inclined to the horizontal against which an inventory of 3-dimensional chips is placed for loading, said wheel arranged to rotate about a central point;

b) a plurality of narrow grooves, each groove terminated by an inner proximal end and an outer distal end, formed in said upper exposed plate surface directed radially outward toward said circumferential marginal edge and arranged to pass through said inventory of chips when said wheel is rotated about said central point said grooves receiving therein a plurality of the chips in restricted orientation;

c) a transfer cavity defined by side walls and a floor formed in said wheel, and depending from said distal end of said groove inboard said outer marginal edge for receipt therein of a chip from said groove in specific, fixed orientation;

d) said outer marginal edge forming an aperture therethrough for transferring the chip from said cavity to said carrier belt; and, e) transport means for urging the chip in a specific, fixed orientation from said cavity outward through said aperture in a direction different than the direction from which the chip entered said cavity.

29. The chip terminating machine of claim 28 further including a carrier belt having a plurality of flexible masks therein, each mask having formed therethrough a slot for receipt of a chip therein for later processing, and wherein said transport means urges the chip outward through said aperture and into said slot in said mask in an angled orientation different than the orientation of the chip in said cavity.

30. The chip terminating machine of claim 28 wherein said transport means includes a single wheel arranged to penetrate said transfer cavity and contact the chip located therein at a point apart from its center of gravity so that the chip is rotated as it moves from said cavity outward into said mask.

31. The chip terminating device of claim 28 further including a separate control means arranged for contacting the chip after transfer from said transfer cavity for rotating the chip in said mask into an orientation different than the orientation of the chip when it first entered said mask.

32. The chip terminating machine of claim 31 wherein said separate control means comprises a rotating wheel for contact with the chip in said mask.

33. The chip terminating machine of claim 31 wherein said separate control means comprises at least two rotating wheels, each said wheel arranged to contact the chip at different times during its travel in said transfer belt for rotating the chip in said mask at least 90° about its center of gravity.

34. The chip terminating machine of claim 31 further including a roller having a surface adapted to rotate into contact with a surface on the chip, said roller including:
   a) a plurality of grooves formed concentrically in said surface of said roller separated by interior groove walls;
   b) a vat of solderable paste having a surface in contact with said surface of said roller to transfer a charge of paste from said vat onto said roller surface; and,
   c) a scraper, including a scraping edge, in contact with said roller surface for scraping the excess of solderable paste from said surface of said roller and arranged at an angle to said roller surface to slightly compress the paste in said grooves so that said paste later mounds slightly in said grooves, above the tops of said groove walls, after said roller surface exits from under said scraping edge, for direct application to the chip.

35. The chip terminating machine of claim 26 further including an alignment plate rigidly attached adjacent said mask and containing a highly polished area arranged at an acute angle to the path of the chips in said masks, for gradual contact with the chips in said masks, to align them in specific order and alignment after they have been inserted in said masks.

36. A machine for terminating a computer chip with one or more stripes of a solderable paste, comprising:
   a) a feed plate wheel defined by a circumferential marginal edge and having an upper exposed plate surface inclined to the horizontal for supporting an inventory of 3-dimensional chips for loading, said wheel arranged to rotate about a central point;
   b) a chip distributing ring centrally located over said exposed plate surface and rigidly attached thereto and including a plurality of outwardly extending arms having a series of pockets formed therebetween for capture of the loose chips to prevent them from falling across said upper exposed plate surface;
   c) a plurality of narrow grooves, terminated by an inner proximal end and an outer distal end, formed in said upper exposed plate surface directed radially outwardly toward said marginal edge and arranged to pass through the inventory of chips when said wheel rotates and receive therein at least one of the chips in restricted orientation;
   d) an open-topped transfer cavity, outboard of each said distal end of each said groove, defined by enclosed side walls and a floor, formed in said wheel, and depending from said groove inboard said outer marginal edge wall for receipt therein of a chip from said groove in specific fixed orientation;
   e) said outer marginal edge wall having an aperture formed therethrough for transferring the chip from said cavity;
   f) transport means for urging the chip in a specific fixed orientation from said cavity outward through said aperture in a direction different than the direction from which the chip entered said cavity;
   g) a carrier belt having a plurality of flexible masks therein, each mask having formed therethrough a slot for receipt of a chip therein for later processing, and wherein said transport means urges the chip outward through said aperture and into said slot in said mask; and,
   h) means for painting a stripe of paste on a surface of the chip.

37. The machine of claim 36 wherein said means for painting a stripe of paste on a surface of the chip comprises:
   a) a roller having a surface adapted to rotate into contact with a surface on the chip, said roller including a plurality of grooves formed concentrically in said surface of said roller separated by interior groove walls,
   b) a vat of solderable paste having a surface in contact with said surface of said roller to transfer a charge of paste from said vat onto said roller surface; and,
   c) a scraper, including a scraping edge, in contact with said roller surface for scraping the excess of solderable paste from said surface of said roller and arranged at an angle to said roller surface to slightly compress the paste in said grooves so that said paste mounds slightly in said grooves, above the tops of said groove walls, after said roller surface exits from under said scraping edge to paint a stripe of paste on a surface of the chip.

38. The machine of claim 36 wherein said means for painting a stripe of paste on a surface of the chip comprises:
   a) a circumferential wheel having a circumferential paste application surface on which a layer of paste is applied;
   b) a comb-shaped scraper for application to the surface of said wheel to scrape away the paste from between said surfaces and to scrape the layer of paste remaining on top of said application surfaces to a finite and controlled depth for touching said application surface to the chip so that the paste is transferred from said surface to the appropriate chip surface.

39. The machine of claim 36 further including means to pre-open said slot in said mask to allow the chip to be inserted therein without abrading said mask.

40. The machine of claim 39 wherein said means to pre-open said slot in said mask includes a blunt tooth, mounted on a wheel, said wheel arranged to bring said tooth into contact with said slit in said mask, on the opposite side of said mask from where the chip will be inserted into said mask, to push said mask slightly and part said slit in said mask in the direction from where the chip is to be inserted in said slot.

* * * * *